US008748730B2

(12) United States Patent
Kornfield et al.

(10) Patent No.: US 8,748,730 B2
(45) Date of Patent: Jun. 10, 2014

(54) SYSTEMS AND METHODS FOR CONCENTRATING SOLAR ENERGY WITHOUT TRACKING THE SUN

(75) Inventors: Julia A. Kornfield, Pasadena, CA (US); Richard C. Flagan, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 476 days.

(21) Appl. No.: 12/723,625

(22) Filed: Mar. 13, 2010

(65) Prior Publication Data
US 2010/0258170 A1 Oct. 14, 2010

Related U.S. Application Data

(60) Provisional application No. 61/160,108, filed on Mar. 13, 2009.

(51) Int. Cl.
*H01L 31/052* (2014.01)

(52) U.S. Cl.
USPC .......................... 136/246; 136/251; 136/244

(58) Field of Classification Search
USPC ................................................. 136/243–265
See application file for complete search history.

(56) References Cited

U.S. PATENT DOCUMENTS

| | | | |
|---|---|---|---|
| 4,130,107 A | 12/1978 | Rabl et al. | |
| 4,494,529 A * | 1/1985 | Lew | 126/648 |
| 4,541,415 A | 9/1985 | Mori | |
| 4,691,994 A | 9/1987 | Afian et al. | |
| 5,118,361 A | 6/1992 | Fraas et al. | |
| 5,783,856 A | 7/1998 | Smith et al. | |
| 5,824,186 A | 10/1998 | Smith et al. | |
| 6,700,054 B2 | 3/2004 | Cherney et al. | |
| 7,121,496 B2 | 10/2006 | Jackson | |
| 7,172,789 B2 | 2/2007 | Smith et al. | |
| 7,182,495 B2 | 2/2007 | Cianciotto et al. | |
| 7,470,386 B2 | 12/2008 | Kang et al. | |
| 7,616,368 B2 | 11/2009 | Hagood, IV | |
| 2008/0212319 A1* | 9/2008 | Klipstein | 362/231 |
| 2009/0151770 A1* | 6/2009 | Gibson et al. | 136/246 |
| 2009/0223551 A1 | 9/2009 | Reddy et al. | |
| 2009/0223555 A1 | 9/2009 | Ammar | |

(Continued)

OTHER PUBLICATIONS

Alien Technology Corporation; "FSA Manufacturing"; http://www.alientechnology.com/fsa_manufacturing.php; Jun. 14, 2010; 1 page.

(Continued)

*Primary Examiner* — Jayne Mershon
(74) *Attorney, Agent, or Firm* — Christie, Parker & Hale, LLP

(57) ABSTRACT

Systems and methods for concentrating solar energy without tracking the sun are provided. In one embodiment, the invention relates to a solar collector assembly for collecting and concentrating light for solar cell assemblies, the collector assembly including an array of solar collectors, each including a funnel shaped collector including a side wall defining a tapered opening having a base aperture and an upper aperture, the side wall including an outer surface, and a solar cell assembly positioned at the base aperture, where the outer surface is coated with a material that substantially reflects light, where the upper aperture is wider than the base aperture, where the funnel shaped collector is configured to substantially confine light, incident via the upper aperture, within the funnel shaped collector until the light exits proximate the base aperture, and where the solar cell assembly is configured to capture light exiting the base aperture.

20 Claims, 8 Drawing Sheets

(56) References Cited

U.S. PATENT DOCUMENTS

| | | | |
|---|---|---|---|
| 2009/0272424 A1* | 11/2009 | Ortabasi | 136/246 |
| 2009/0314329 A1* | 12/2009 | Saha | 136/246 |
| 2010/0012172 A1 | 1/2010 | Meakin et al. | |
| 2010/0043880 A1* | 2/2010 | Bhaumik et al. | 136/257 |

OTHER PUBLICATIONS

Ned Bowden et al.; "Self-Assembly of Mesoscale Objects into Ordered Two-Dimensional Arrays"; *Science* vol. 276; Apr. 11, 1997; pp. 233-235.

Michael J. Currie et al.; "High-Efficiency Organic Solar Concenrators for Photovoltaics"; *Science* vol. 321; Jul. 11, 2008; pp. 226-228.

Jeffrey M. Gordon; "Unfolded aplanats for high-concentration photovoltaics"; *Optical Society of America* vol. 33 No. 10; May 15, 2008; pp. 1114-1116.

D. Jenkins et al.; "Integral design method for nonimaging concentrators"; *Optical Society of America* vol. 13 No. 10; Oct. 1996; pp. 2106-2116.

Mikkel Jorgensen et al.; "Stability/degradation of polymer solar cells"; *Solar Energy Materials and Solar Cells* vol. 92; Mar. 10, 2008; pp. 686-714.

Richard R. King; "Record breakers"; *Nature Photonics* vol. 2; May 2008; pp. 284-286.

M. Morgan et al.; "LIPS III Light Funnel Experiment"; *IEEE*; 1989; pp. 411-414.

Boeing Aerospace Company; "Final Report: Light Funnel Concentrator Panel for Solar Power, Contract #NAS8-36463 (D180-30473-1)"; Submitted to NASA Marshall Space Flight Center; May 1987; 60 pages.

Johan Nilsson; "Optical Design and Characterization of Solar Concentrators for Photovoltaics"; Licentiate Thesis at *Lund University, Department of Architecture and Built Environment, Division of Energy and Building Design*; 2005; 226 pages.

Uthara Srinivasan et al.; "Fluidic Self-Assembly of Micromirrors Onto Microactuators Using Capillary Forces"; *IEEE Journal on Selected Topics in Quantum Electronics* vol. 8, No. 1; Jan./Feb. 2002; pp. 4-11.

W. T. Welford et al.; "Nonconventional optical systems and the brightness theorem"; *Optical Society of America* vol. 21, No. 9; May 1, 1982; pp. 1531-1533.

International Search Report for Application No. PCT/US10/27257 filed Mar. 13, 2010, dated May 11, 2010, mailed Jun. 9, 2010, 2 pages.

Written Opinion for Application No. PCT/US10/27257 filed Mar. 13, 2010, dated May 11, 2010, mailed Jun. 9, 2010, 6 pages.

\* cited by examiner

SYSTEMS AND METHODS FOR CONCENTRATING SOLAR ENERGY WITHOUT TRACKING THE SUN

CROSS-REFERENCE TO RELATED APPLICATION(S)

The present application claims the benefit of U.S. Provisional Application No. 61/160,108, filed Mar. 13, 2009, entitled "Concentrating Solar Energy—Without Tracking the Sun", the entire content of which is incorporated herein by reference.

STATEMENT REGARDING FEDERALLY SPONSORED RESEARCH

The U.S. Government has certain rights in this invention pursuant to Grant No. DMR0505393 awarded by the National Science Foundation.

FIELD OF THE INVENTION

The present invention relates generally to systems and methods for capturing solar energy, and more specifically, to systems and methods for concentrating solar energy without tracking the sun.

BACKGROUND

The challenge of increasing solar energy conversion to a terawatt (TW) scale is brought into focus by considering three economic factors: the initial capital investment, the "expected lifetime" of the equipment and the amount of energy it provides. These factors are reflected in the financial "Pay Back Time" (PBT). Current crystalline silicon (c-Si) solar photovoltaic (PV) panels have a service life of 25 or more years and a PBT that, depending on the location where they are installed, ranges from 10 to 25 years. Many celebrated "breakthroughs" in solar energy conversion pale when confronted with economic realities: their PBT is greater than their service life. This is currently the case for technologies such as triple-junction solar cells, dye-based solar concentrators and organic PV.

To improve the landscape of solar energy conversion, it would be beneficial to provide an efficient and cost effective solar collector assembly and method for manufacturing the solar collector assembly.

SUMMARY OF THE INVENTION

Aspects of the invention relate to systems and methods for concentrating solar energy without tracking the sun. In one embodiment, the invention relates to a solar collector assembly for collecting and concentrating light for solar cell assemblies, the collector assembly including an array of solar collectors, each including a funnel shaped collector including a side wall defining a tapered opening having a base aperture and an upper aperture, the side wall including an outer surface, and a solar cell assembly positioned at the base aperture, where the outer surface is coated with a material that substantially reflects light, where the upper aperture is wider than the base aperture, where the funnel shaped collector is configured to substantially confine light, incident via the upper aperture, within the funnel shaped collector until the light exits proximate the base aperture, and where the solar cell assembly is configured to capture light exiting the base aperture.

In another embodiment, the invention relates to a method for manufacturing a solar collector array assembly for collecting and concentrating light for solar cells assemblies, the method including using a first die to form an array of tapered openings in a substrate including a first material, depositing a reflective material in at least one tapered opening of the array of tapered openings, depositing a second material on the reflective material to form an array of funnel shaped collectors, each having a base aperture and an upper aperture wider than the base aperture, and positioning at least one solar cell assembly below at least one of the base apertures of the funnel shaped collectors.

DETAILED DESCRIPTION OF THE INVENTION

Figure 1:
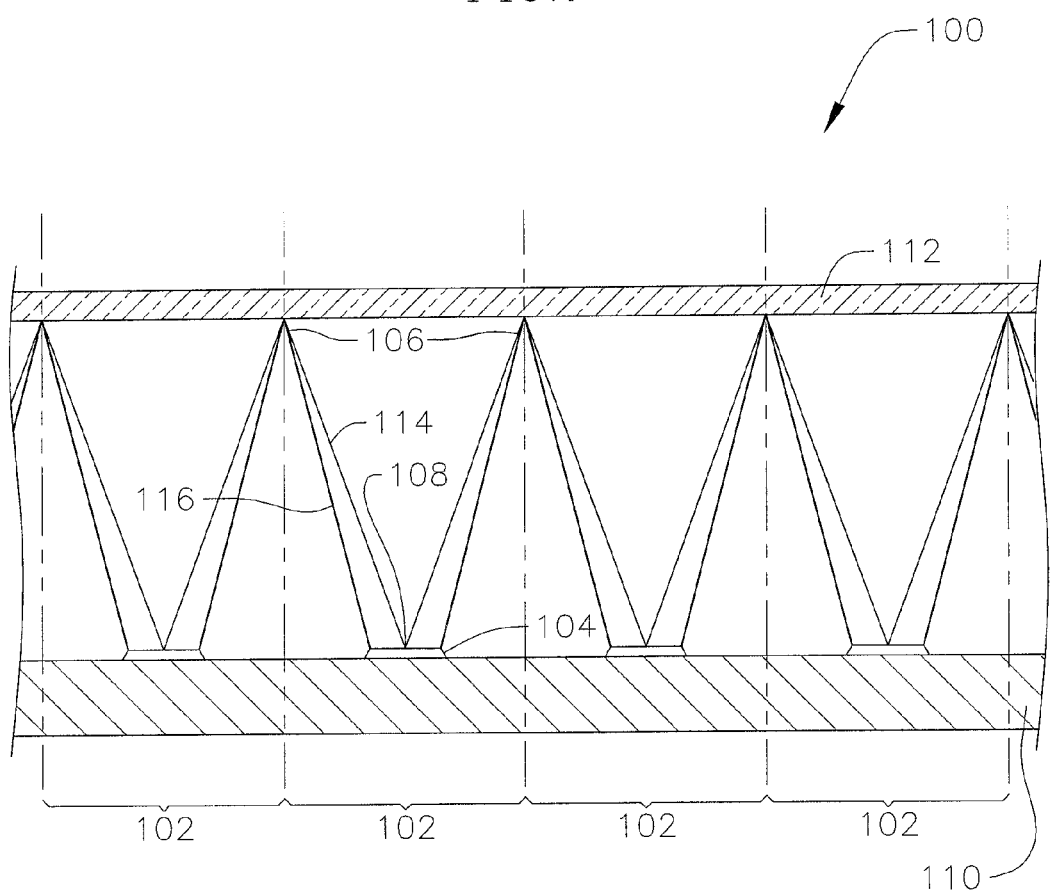
FIG. 1 is a cross-sectional view of a portion of a solar collector assembly including multiple funnel shaped collectors for collecting and concentrating light on solar cell assemblies in accordance with one embodiment of the invention.

Referring now to the drawings, embodiments of the solar collector assemblies described herein can address current limitations due to materials, device fabrication and system lifetime. The solar collector assemblies can capture and concentrate both direct and diffuse irradiation without the need for solar tracking. Optical and thermal considerations are addressed to create solar collector assemblies that seek to avoid deleterious photochemical and thermal stresses on the materials of construction and the contacts between them. A "light funnel" directs light entering a relatively large orifice onto a much smaller exit. In contrast to conventional reflective light funnels, that only capture light in a narrow range of incidence angles, embodiments of the present invention can make use of refractive funnels and capture light in a relatively broad range of incident angles.

Embodiments of the solar collector assemblies include an array of funnel shaped collectors positioned above a corresponding array of solar cell assemblies. Each of the funnel shaped collectors can be formed from a substantially transparent material. Each of the funnel shaped collectors has a side wall defining a tapered opening forming a base or exit aperture positioned proximate to a solar cell assembly and an upper aperture through which light enters the collector. The side wall can have an inner surface on the inside of the tapered opening and a outer surface on the outside of the tapered opening, where the thickness of the side wall increases as the side wall extends from the upper aperture to the base aperture. In many embodiments, the outer surface can be coated with a reflective material for reflecting incident light. In operation, the funnel shaped collectors substantially confine light, incident via the upper opening, within the collectors until the light exits the base aperture and is received by the solar cell. In many embodiments, the funnel shaped collectors are formed using one or more polymers.

In several embodiments, the solar collector assemblies are formed using one or more manufacturing processes including, for example, roll-to-roll processes for forming the funnel shaped collectors, fluidic self assembly processes for placing the solar cells on a base substrate or an array of funnel shaped collectors, and various attachment processes for attaching the funnel shaped collectors to the base substrate and a encapsulation substrate. In some embodiments, the base substrate is made of aluminum and the encapsulation substrate is made of glass. In some embodiments, the funnel collectors are not attached to the solar cells on the base substrate. In such case, each funnel collector and respective solar cell are positioned proximate each other such that the solar cell receives light captured by the funnel collector. In several embodiments, the funnel shaped collectors are substantially small in size. In such case, the small scale of the focused energy regions enables efficient heat transfer that minimizes the temperature rise of the solar cell and enables the use of microfluidic technologies that facilitate efficient mixing and mass transfer between fluid streams.

In several embodiments, the solar collector assemblies are densely packed and on par with the energy collecting capabilities of conventional solar panels such that each square meter contains more 10,000 to as many as 1,000,000 concentrators. In such case, the funnel shaped collectors are miniaturized and the solar cell assemblies can therefore be correspondingly small. The small scale components provide great benefits in improving the ease and cost manufacturing solar collectors.

The terms solar cell and solar cell assembly are used interchangeably herein to refer broadly to any number of devices that receive light and convert it to energy or that use solar energy to produce useful chemicals or products such as hydrogen or various hydrocarbons.

In a number of embodiments, the region beyond the outer surface of the side wall of the funnel shaped collectors can be either empty or filled with a supporting material. In the case where the region is filled with a supporting material, the supporting material joins several of the funnel shaped collectors together.

In contrast to the systems and methods described herein, funnel shaped collectors having a hexagonal-pyramid shape formed of glass including antireflective coatings on an inner surface of the glass were described in a study and subsequent publication entitled, "LIGHT FUNNEL CONCENTRATOR PANEL FOR SOLAR POWER", the entire content of which is incorporated herein by reference. The study was conducted by Boeing for NASA and published in 1987. However, because it relies on internal reflection at the outer surface, the Boeing system inefficiently allows a significant fraction of light to escape the outer surface. In addition, due to the use of glass to form the funnel shaped collectors in the Boeing system, and the large size of the funnel shaped collectors in the Boeing system, the material costs and manufacturing processes of the Boeing system are time consuming and expensive. Moreover, the resulting funnels are fragile. It is believed that the Boeing system has not been commercialized or further developed because of these deficiencies.

Numerous conventional technologies achieve cost reductions through the use of solar concentrators. Focusing concentrators in the form of large arrays of mirrors that reflect sunlight onto a central receiver are employed on solar thermal systems for power generation or chemical process operation. Arrays of micro-scale mirrors are employed in some photovoltaic power generation systems. Other concentrators employ curved mirrors that focus light onto photovoltaic cells. Yet other solar concentrators employ lenses, either in the form of a large Fresnel lens for a single photovoltaic device, or in the form of large arrays of smaller Fresnel or simple lenses that focus sunlight onto arrays of small photovoltaic cells. These focusing devices are subject to the so-called thermodynamic limit of solar concentrators. (Ref W. T. Welford and R. Winston, Nonconventional optical systems and the brightness theorem, Applied Optics 21: 1531-1533 (1982), wherein the brightness of the focused image cannot exceed that of the incident radiation. The ratio of the amount of light entering per unit area at the entrance aperture at the top of the concentrator to the amount of light per unit area leaving through the exit aperture at the base of the concentrator (known as the concentration ratio) is then limited to:

$$C_r = \left(\frac{n_{pyramid}\sin\alpha_{out,max}}{n_{air}\sin\alpha_{in,max}}\right)^2 = \left(\frac{n_{pyramid}}{\sin\alpha_{in,max}}\right)^2$$

where the refractive index is n and $n_{air}=1$, and the acceptance angle for the inlet is $\alpha_{in,max}$. Thus, it is apparent that as the concentration ratio of a focusing concentrator is increased, the acceptance angle narrows. For a polymeric lens with n=1.5 and a concentration ratio of 20, the acceptance angle is 19.6°; for a concentration ratio of 100, the acceptance angle reduces to 8.6°. Because of the small acceptance angles, it is apparent that conventional solar concentrators generally require some form of tracking system to ensure that the concentrator focuses the image of the sun on the solar energy conversion device. This tracking system however adds complexity and increases the cost of the solar energy conversion system. Moreover, given the long life required for financial payback, the tracking systems reduce the reliability and add to maintenance costs for the system. Reflective funnel concentrators do not focus an image of the sun on the solar energy conversion device (U.S. Pat. No. 4,130,107; D. Jenkins and R. Winston. Integral design method for nonimaging concentrators, J. Opt. Soc. A,m. A 108: 2106, 1996; Johan Nilsson, Optical Design and Characterization of Solar Concentrators for Photovoltaics, Licentiate Thesis, Department of Architecture and Built Environment, Lund University, Report EBD-T-05/6, 2005). However, after a limited number of reflections within the funnel, light may exit out the top of the reflective funnel concentrator.

A number of technologies attempt to reduce sensitivity to the pointing direction by coupling a lens with a reflective light funnel, see for example, U.S. Pat. No. 5,118,361 and U.S. Pat. Publ. No. 2009/0223555. These technologies increase the acceptance angle somewhat but are ultimately unsatisfactory. Embodiments of the present invention do not require tracking systems and collect light at a wide range of incident angles.

FIG. 1 is a cross-sectional view of a portion of a solar collector assembly 100 including four funnel shaped collectors 102 for collecting and concentrating light on solar cell assemblies 104 in accordance with one embodiment of the invention. Each of the funnel collectors 102 has a tapered cross section having narrow upper ends 106 and a wider base end 108 that rests on one of the solar cells 104. The solar cells 104 are positioned on a base substrate 110. The upper ends 106 of the tapered cross section are coupled to an encapsulation substrate 112. In other embodiments, the solar collector assembly does not include an encapsulation substrate. Each of the sides of the tapered cross section of a funnel collector 102 has a front surface 114 on the inside of the funnel and a outer surface 116 on the outside of the funnel. The funnel collectors 102 can be made of one or more suitable polymeric materials as described below.

A reflective coating can be deposited on the outer surface 116 of the funnel collectors. In one embodiment, the reflective coating is made of aluminum. In other embodiments, reflective coating is made of other suitable materials, including, without limitation, silver, nickel, reflective polymers, dielectric layers, or other suitable reflective materials. The reflective layer may be a thin layer of metal, such as aluminum, silver, gold or appropriate alloys. The reflective layer may be a dielectric coating that uses materials with different refractive index applied in thin layers whose composition, thickness, and number produce the desired reflectivity. The reflective layer may include both dielectric layers and metal layers. The reflective layer may be a reflective polymer.

The solar cells 104 can be attached to both the base substrate and funnel collectors using various attachment methods as described below.

In the embodiment illustrated in FIG. 1, the encapsulation substrate 112 is made of glass. In other embodiments, the encapsulation substrate can be made of other suitable materials, including, without limitation, acrylic polycarbonate resin. In the embodiment illustrated in FIG. 1, the base substrate 110 is made of aluminum. In other embodiments, the base substrate can be made of other suitable materials having sufficient strength and corrosion resistance. In the embodiment illustrated in FIG. 1, the portion of the collector assembly 100 includes four funnel collectors 102 in a line. In other embodiments, the collector assembly can include more than or less than four funnel collectors, either in a line or in a suitable two-dimensional array. In the embodiment illustrated in FIG. 1, the funnel collectors are made partially or entirely of synthetic polymeric materials. In other embodiments, the funnel collectors can be made of other materials having suitable reflective and light transmissive properties. The polymers can be any polymeric material or synthetic polymeric materials. In one embodiment, the polymers used for the funnel collectors are clear, colorless and highly tolerant of solar radiation. In several embodiments, at least one polymer used is highly light transmissive. In several embodiments, more than one polymer material is used to form a funnel collector. In one such case, one polymer material may be transparent while other polymer materials are not.

In operation, light impinging upon the funnel collectors 102 at various angles enters the funnel collectors and is internally reflected at the outer surface 116 and the front surface 114 until exiting the funnel collector proximate the base aperture 108. The solar cells 104 absorb the light exiting the base aperture 108 and convert it to electrical energy. The reflective outer surface of the funnel collectors can eliminate transmission losses at the surface, providing more efficient performance than a collector having a non-reflective outer surface. The use of a polymer material for the funnel collectors enables them to be made by inexpensive and efficient manufacturing processes, as detailed below. In one embodiment, anti-reflective coatings are applied to the inner surface. In another embodiment, anti-reflective coatings are applied to the encapsulating layer.

In the embodiment illustrated in FIG. 1, inner surface 114 and outer surface 116 are flat surfaces. In other embodiments, these surfaces can be curved. In the embodiment illustrated in FIG. 1, encapsulation substrate 112 and base substrate 110 are flat. In other embodiments, these surfaces can be curved.

In the embodiment of FIG. 1, the region beyond the outer surface of the side wall can be either empty or filled with a supporting material. In the case where the region is filled with a supporting material, the supporting material joins several of the funnel shaped collectors together.

Figure 2:
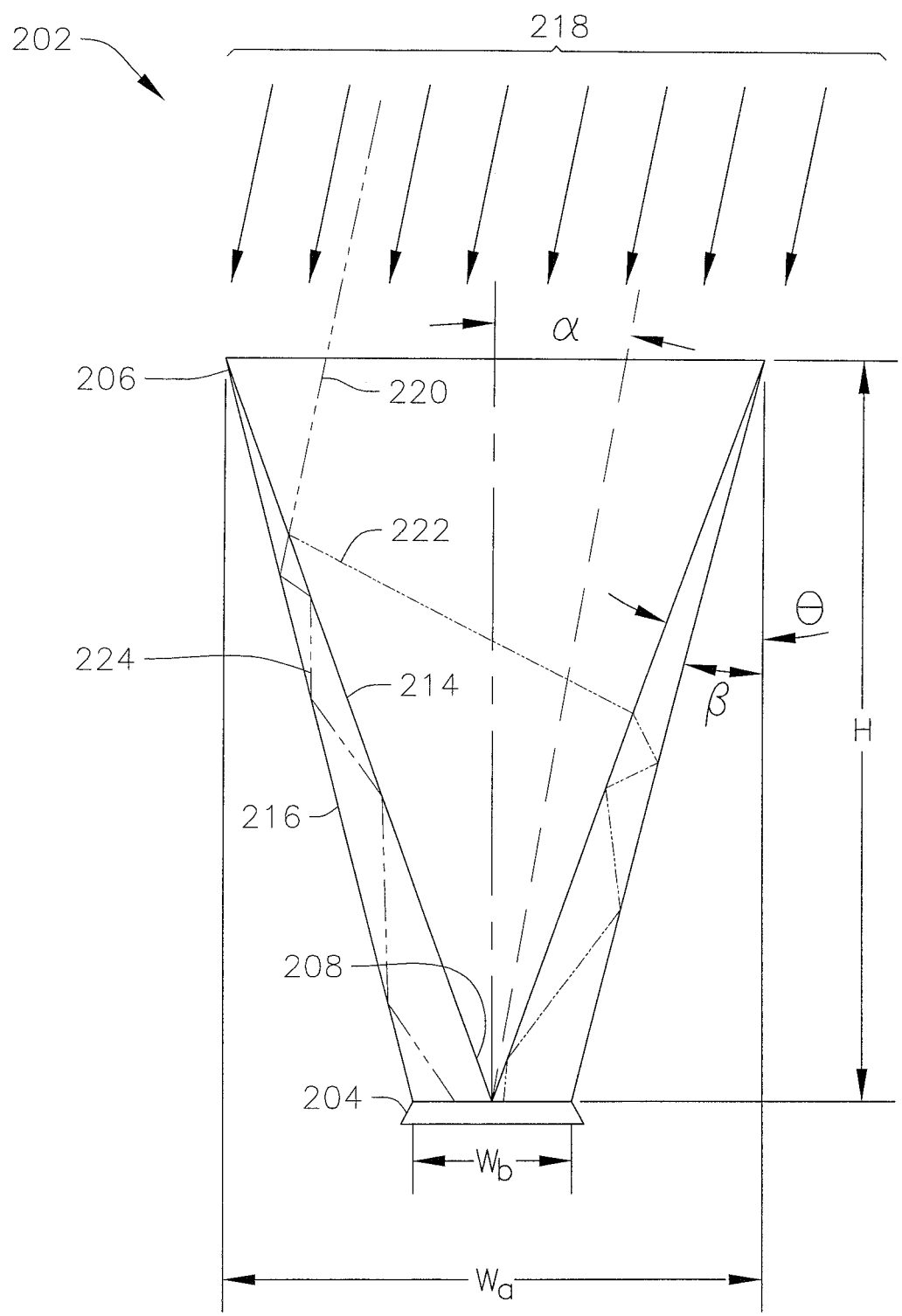
FIG. 2 is an enlarged cross sectional view of one funnel shaped collector and solar cell assembly in accordance with one embodiment of the invention.

FIG. 2 is an enlarged cross sectional view of one funnel shaped collector 202 and solar cell 204 in accordance with one embodiment of the invention. The funnel collector 202 has a tapered cross section with narrow upper ends 206 and a wider base end 208 that is attached to, or positioned above, the solar cell 204. Each of the sides of the tapered cross section of the funnel collector 202 has a inner surface 214 on the inside of the funnel and a outer surface 216 on the outside of the funnel, and the thickness of the side wall increases as the side wall extends from the upper end to the base end. As noted above, the funnel collector 202 can be made of one or more polymeric materials. A reflective metal coating can be deposited on the outer surface 216 of the funnel collector. This reflective layer might be formed by vapor deposition, electrochemical deposition, lamination, or other process. The inner surface could be coated with an anti-reflection layer to further improve transmission.

In operation, rays of light 218 are received at a particular angle, α, relative to a central axis of the funnel collector 202 extending normal to a top surface of the solar cell 204. Throughout the course of a day, the angle of incidence, α, will vary as the sun traverses the sky from east to west. However, the collector captures light received over a wide range of angles and redirects it toward the solar cell. For example, light ray 220 is split at the inner surface 214 into a transmitted (refracted) light ray 222 and reflected light ray 224. The reflected light ray 224 impinges upon and enters the funnel collector 202 at the opposite side. Once they enter the body of the funnel collector, each of the light rays 222 and 224 is repeatedly internally reflected by the surfaces 214 and 216 until exiting the base end (e.g., base aperture) 208. Once the light rays (222, 224) exit the base 208, they can be absorbed by solar cell 204 and converted to electrical energy. Light may leave the side wall in one place, but most such escaping light will reenter the side wall in another place. The side walls thus guide the light until it exits proximate the base aperture.

Because the inner and outer surfaces of the tapered concentrator funnel wall diverge, the angle between a ray striking one of those surfaces and the normal to that surface increases with successive reflections. According to Snell's law, the reflectivity at the surface of the high reflectivity polymer (n~1.5) and air (n=1) increases with increasing incidence angle, so the fraction of light that passes from the polymer into the air within decreases with each successive reflection. Eventually, the angle increases beyond a critical value, and the light undergoes total internal reflection on subsequent reflections.

The angle of the back surface 216, β, and the angle of the front surface 214, theta or θ, can be varied in accordance with design goals for a particular implementation. In the embodiment illustrated in FIG. 2, the height H of the funnel collector can be 3.7 millimeters (mm), the upper width Wa can be 2.6 mm, and the base width Wb can be 0.4 mm. In other embodiments, the funnel collectors can have other suitable dimensions.

The dimensions of the funnel collectors can be calculated from the width of the solar cell to be employed, the concentration ratio to be achieved, and the refractive index of the transparent material employed in the side walls. The reflectance of the transparent material increases with increasing angle of the incident light from the direction of the surface normal according to the Fresnel equations. On this basis, an angle of θ=20° from the axis of the funnel has been selected in one embodiment of this invention. Given that angle and the desired concentration ratio, β may be calculated from the following:

$$C_r = \left(\frac{\tan\theta}{\tan\theta - \tan\beta}\right)^2.$$

This assumes that the apex of the inner surface of the pyramid is on the base plane of the funnel concentrator as illustrated in FIG. 2, although in other embodiments the apex may fall above or below the base plane. Continuing the example, the height and width of the funnel concentrator may be calculated from the following:

$$h = \frac{1}{2}\left(\frac{w_b}{\tan\theta - \tan\beta}\right) \text{ and } w_a = 2h\tan\theta$$

Thus, the funnel concentrator for a solar cell of width 200 μm (0.2 mm), concentration ratio $C_r$=20, and having the apex of the inner surface on the base plane would have dimensions of β=15.8°, h=1.23 mm, and $w_a$=0.9 mm. Increasing the concentration ratio to 50 would change the dimensions to β=17.4°, h=1.98 mm, and $w_a$=0.79 mm.

The solar cell can be any single of multiple junction solar cells, including without limitation, solar cells made of elemental, compound organic semiconductors or combinations thereof. In one embodiment, the solar cell may be a single semiconductor photovoltaic cell, a triple-junction photovoltaic cell, a nanopillar or nanoparticle based solar cell, a solar photo-electrochemical conversion cell, a photocatalyst, a thermoelectric device, or a photosynthesis system, either through synthetic chemical processes or biological processes, or other device that converts captured solar energy into a useful form or product. In some embodiments, the solar collector assemblies include a single type of solar cell. In other embodiments, the solar collector assemblies include multiple types of solar cells combined together.

The funnel shaped collectors can be miniaturized along with the corresponding solar cell assemblies. As a result, the solar cell assemblies can be small photovoltaic cells which are thinner than conventional large cells which generally must be thicker for efficient conversion of incident light into electrical current. Thus, a thickness of 200 to 300 μm is employed in silicon solar panels today in order to minimize the breakage of the brittle and fragile solar cell material. By reducing the width of the solar cells from tens of centimeters to a fraction of a millimeter, thinner solar cells can be employed. For silicon photovoltaic cells, light is fully absorbed within about 40 μm thickness. If a reflective layer is applied to the back of the solar cell, the light will take two passes through the solar cell, allowing the thickness to be reduced further to about 20 μm. Thus, an array of the funnel shaped collectors can reduce the mass of silicon required by a factor of 100 or more, greatly reducing the cost of solar panels.

The small size of the solar cell assemblies has additional advantages. The small scale facilitates better heat transfer than is possible with larger cells. By mounting the cells on a high thermal conductivity backing material such as aluminum, absorbed energy can be effectively dissipated. Since the efficiency of photovoltaic cells decreases with increasing temperature, the increased heat transfer minimizes this degradation in performance. Based on this observation, other kinds of solar cells also benefit from reduced size. Reactors for photochemical or photosynthetic conversion processes can be designed to enable rapid diffusion of reactants into and products out from the reaction zone in small scale reactors to facilitate reaction optimization for maximum yield of desirable products. For thermoelectric conversion, the small scale enables maximizing the temperature gradient, allowing the quantity of expensive thermoelectric material to be minimized.

Figure 3:
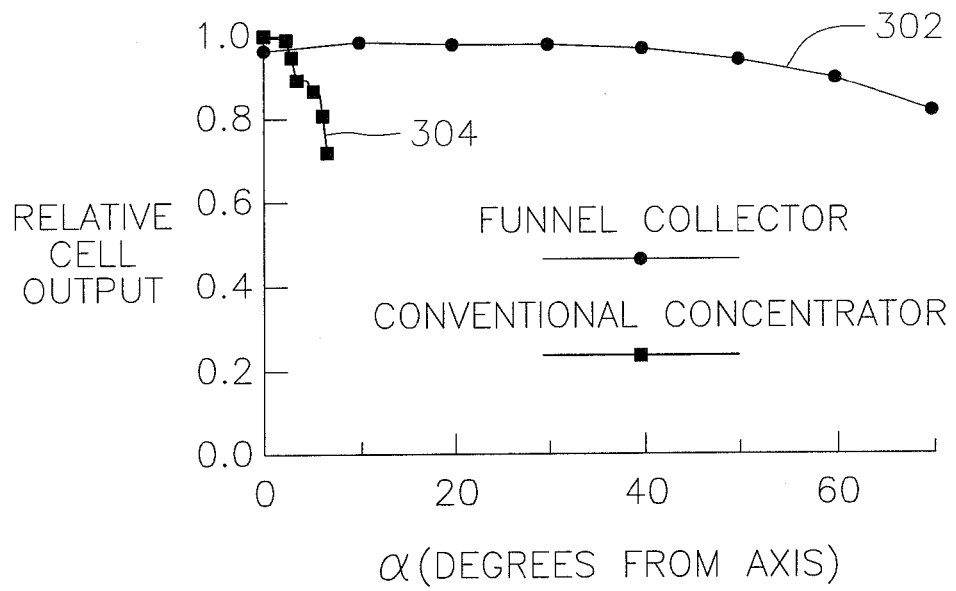
FIG. 3 is a graph illustrating a comparison of the output of a funnel shaped collector relative to normal incidence as a function of the incident angle, $\alpha$, and the relative output of a conventional concentrator in accordance with one embodiment of the invention.

FIG. 3 is a graph illustrating a comparison of the output 302 of a solar cell positioned at the base of a funnel shaped collector relative to normal incidence as a function of the incident angle, α, and the relative output 304 of a conventional concentrator in accordance with one embodiment of the invention. The relative output of the funnel collector 302 illustrates highly efficient capture of light over a wide range of angles of incident light. As can be seen in FIG. 3, the relative output of the funnel collector 302 is nearly constant up to an angle of incidence, α, of approximately 40 degrees and continues with minimal degradation thereafter. The relative output for the conventional concentrator 304, by comparison, tapers off significantly well before the angle of incidence reaches 10 degrees. In one embodiment, the funnel shaped collectors efficiently capture light such that over 96% of entering light reaches the base of the funnel collectors.

Figure 4:
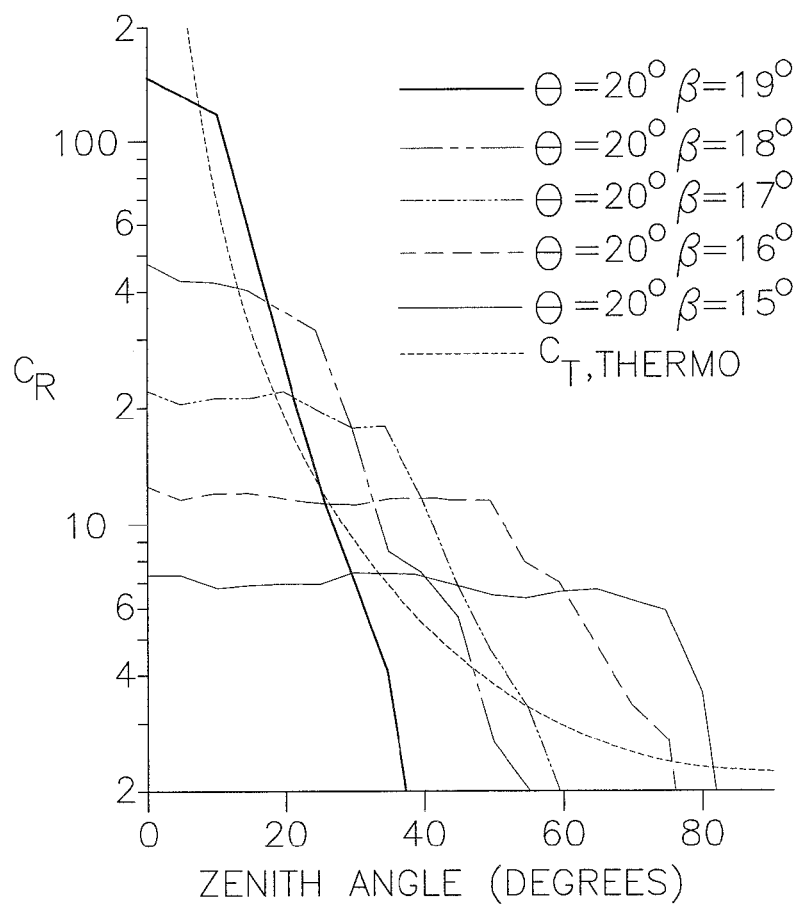
FIG. 4 is a graph illustrating the ratio of solar energy collected and concentrated for a solar cell assembly for various ranges of the outer angle, $\beta$, in accordance with a simulation of one embodiment of the invention.

FIG. 4 is a graph illustrating the ratio of solar energy collected and redirected to a solar cell for various ranges of the outer angle, β, in accordance with a simulation of one embodiment of the invention. While not bound by any particular theory, the dashed CT line indicates a so called thermodynamic limit of a funnel collector. The graph illustrates that collector performance, associated with one embodiment of the funnel collectors of the present invention, increases a width of the plateau over which the concentration ratio is approximately constant beyond conventional limits. In a number of embodiments, the concentration ratio may be set to a preselected limit to allow for efficient heat dissipation in view of the heat transfer characteristics of polymeric materials used for the funnel collectors.

Figure 5:
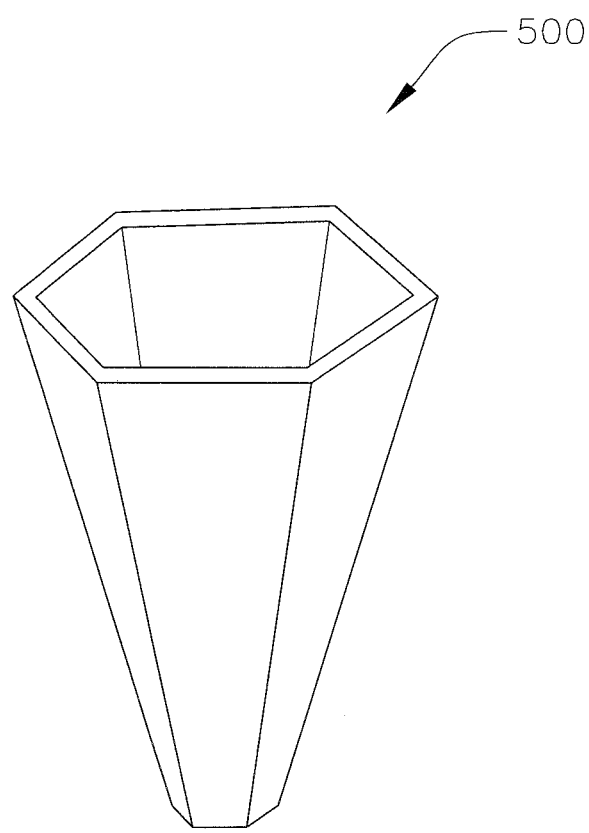
FIG. 5 is a perspective view of a funnel shaped collector in accordance with one embodiment of the invention.

FIG. 5 is a perspective view of a funnel shaped collector 500 in accordance with one embodiment of the invention. In several embodiments, the funnel shaped collector 500 can be used in any of the solar collector assemblies described herein. In the embodiment of FIG. 5, the funnel shaped collector has a hexagonal pyramid shape. That is, it is hexagonal in cross section and takes the shape of an inverted pyramid. In other embodiments, the funnel shaped collector can have other suitable shapes. For example, in one embodiment, the funnel shaped collector can have a polygonal shape, conical shape, a cylindrical shape, or other suitable shape. In other embodiments, the shape of the funnel shaped collector can be optimized for a particular application. In the case of a polygonal shape, the side walls may be planar or curved. In some embodiments, an array of funnel collectors may include only a single type of shaped collector. Alternatively, an array of funnel collectors may include a combination of two or more polygonal shaped collectors.

Figure 6:
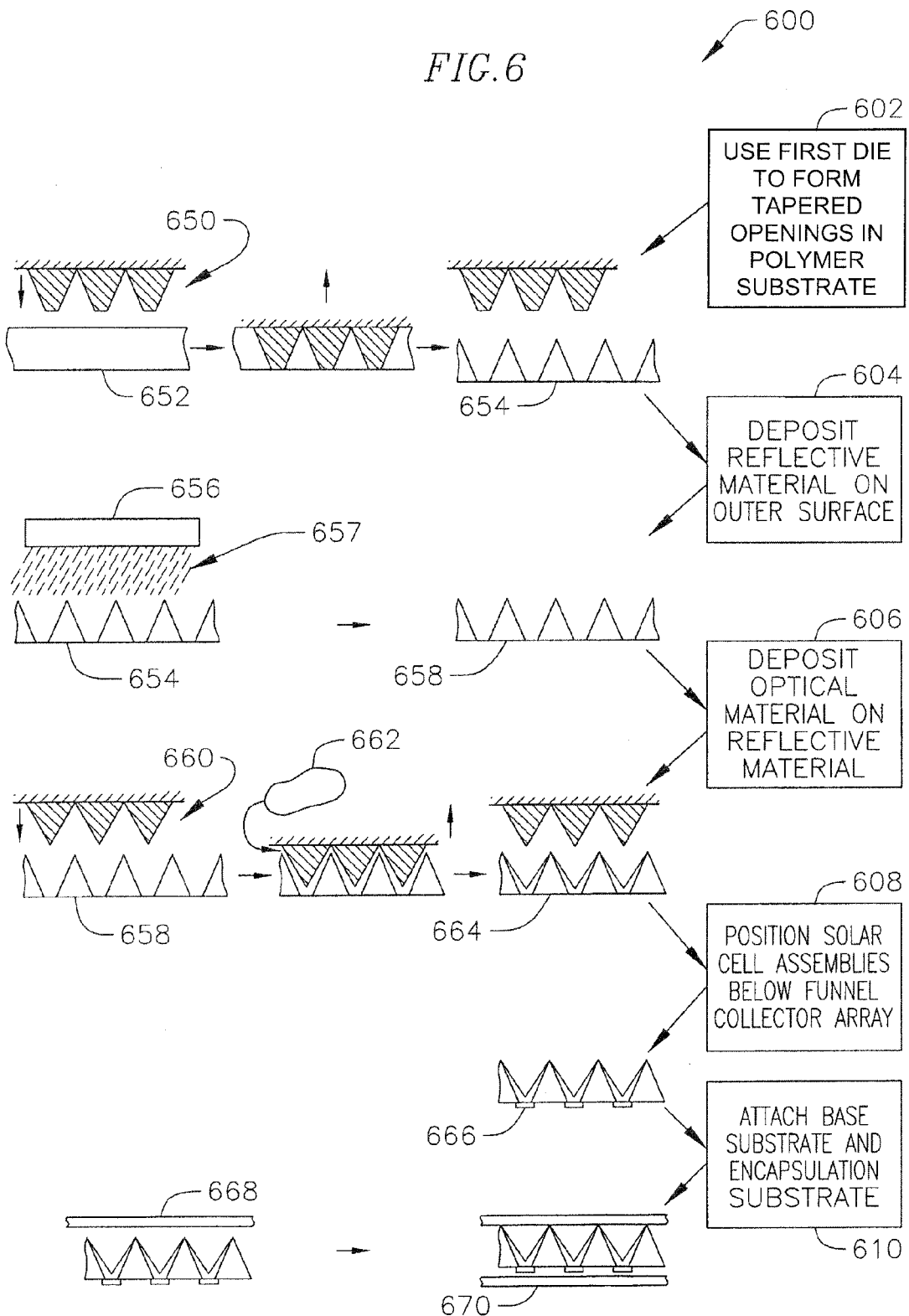
FIG. 6 is a flow diagram of a process for manufacturing a solar collector assembly in accordance with one embodiment of the invention.

FIG. 6 is a flow diagram of a process 600 for manufacturing a solar collector assembly in accordance with one embodiment of the invention. The process first uses (602) a first die 650 to form tapered openings in a polymer substrate 652. In several embodiments, the process forms the tapered openings in the polymer substrate using a preselected spacing. In several embodiments, the polymer substrate is made from one or more polymers that is robust and has a wide service temperature. In a number of embodiments, the polymer substrate is not transparent. In one embodiment, the polymer substrate is made of epoxies, thermosets, fracture resistant blends such as the polypropylene/elastomer blends used for car exteriors, other suitable materials, or combinations thereof. In a number of embodiments, the process forms the tapered openings in the polymer substrate using roll-to-roll processes or belt-to-belt processes. For example, the tapered openings may be formed from a continuous sheet of polymeric material by stamping the polymeric material as it travels from a roll of sheet stock to a roll of processed material. More specific examples of roll-to-roll processes are described in U.S. Patent Publication No. 2009/0223551, U.S. Pat. No. 7,121,496, U.S. Pat. No. 7,470,386, the entire content of each document is incorporated herein by reference.

In some embodiments, the tapered openings are formed from a liquid polymer that is then solidified to preserve the tapered opening by cooling, by crystallization, or by polymerization induced by heat or light. In one such embodiment, a fast-curing photo-polymerization step would be used to solidify the polymer into the desired shape of tapered opening.

In the process illustrated in FIG. 6, the substrate 652 is made of a polymer. In other embodiments, the substrate can be made of other suitable materials. Examples of other suitable materials include metals and other materials having structural characteristics suitable for forming tapered openings. In one such embodiment, the metallic tapered openings can be formed with reflective surfaces, thereby eliminating the need for coating with a reflective material.

The process then deposits (604) a reflective material 657 on the outer surface of each of the tapered openings of the tapered opening array 654 using a deposition assembly 656. In several embodiments, the reflective material is deposited using a vapor deposition or evaporative process. In other embodiments, other methods of depositing a reflective material can be used, including without limitation, sputtering or chemical vapor deposition. In one embodiment, the reflective coating is made of aluminum. In other embodiments, reflective coating is made of other suitable materials, including, without limitation, silver, nickel, reflective polymers, dielectric layers, or other suitable reflective materials. The reflective layer may be a thin layers of metal, such as aluminum, silver, gold or appropriate alloys. The reflective layer may be a dielectric coating that uses materials with different refractive indexes applied in thin layers whose composition, thickness, and number produce the desired reflectivity. The reflective layer may include both dielectric layers and metal layers. In one embodiment, the reflective layer may be a reflective polymer.

The process then deposits (606) optical material 662 on to the reflective material 657 of the aperture array 658. In the embodiment illustrated in FIG. 6, the process deposits the optical material by partially inserting a second die 660 into the tapered openings of the tapered opening array 654, thereby leaving a gap having a preselected thickness, and inserting the optical material 662 into the gap. In the case of a molten or liquid material, solidification of the desired shape can be accomplished by cooling, by crystallization, by polymerization induced by heat or light, or other known solidification process. In one such embodiment, a fast-curing photo-polymerization would be used. When the second die 660 is removed, an array of funnel shaped collectors 664 having light capturing side walls is produced. Each of the funnel shaped collectors can have a base end and an upper end that wider than the base end. In several embodiments, the optical material is a transparent polymer can retain its transparency after many years of exposure to bright light. In one embodiment, the optical material is a polymer including silicone, acrylic or combination thereof. In other embodiments, optical material can be a polymer not yet released that is able to retain its transparency after many years of exposure to bright light. Polymers of this nature are being developed and can be used in forming funnel shaped collectors described herein. In several embodiments, the optical material is a refractive material.

The process then positions (608) solar cell assemblies 666 below the funnel collector array 664. In one embodiment, the positioning is accomplished using a fluidic self assembly process. In other embodiments, the positioning can be accomplished using other suitable processes. In one embodiment, the positioning can be accomplished using any continuous process for manufacturing such a solar collector assembly including, but not limited to, affixing the solar cells to a substrate for transfer to the base of the funnels or for lamination of the substrate to the base of the funnel array. This may include processing of continuous bands of the different layers or the use of bands that transfer solar cells, electrical or fluid conduits. In yet another embodiment, the fabrication may be accomplished by panel-by-panel embossing, molding, or stamping in order to enable extraction of the sharp form features from the pyramid assemblies by motion that is aligned with the axis of the pyramid assemblies.

The process may attach (610) an encapsulation substrate 668 to the upper ends of the funnel shaped collector array. The process may also attach (610) a base substrate 670, including connective circuitry for coupling the solar cell assemblies to one another and to external energy receiving devices, to the solar cell assemblies on the bottom surface of the funnel collector array.

In one embodiment, the solar cell assemblies can be a photovoltaic assembly or thermoelectric assembly. In such case, the wiring that collects the current would likely be applied before deposition of the solar cells (analogous to production of RFID tags today). A typical method of applying the circuits would be screen printing or roll-to-roll printing. Then the cells would be put in place and connected to the circuit in a single step, for example using self-soldering contacts (as in the production of RFID tags). A thin insulating layer separates the wires from the aluminum substrate; most likely it would be on the aluminum sheet prior to lamination and would also serve as an adhesive. A typical insulating/bonding layer would be ethylene-vinylacetate copolymer (EVA).

In another embodiment, the solar cell assemblies can be a photochemical assembly. In such case, after cells are in place, microfluidic channels would be created under them to deliver substrate(s) and remove product(s). Methods to create microfluidic channels include molding them into the substrate, which would then be plastic instead of aluminum, or by using a combination of channels in the substrate for the large channels and printing a pattern of hydrophilic versus hydrophobic surface treatments to control the fine-scale flow of reactant and product streams.

In some embodiments, the process does not perform all of the actions described in FIG. 6. In other embodiments, the process performs additional actions. In one embodiment, the process performs the actions in a different order than illustrated. In some embodiments, the process performs some of the actions simultaneously.

Figure 7:
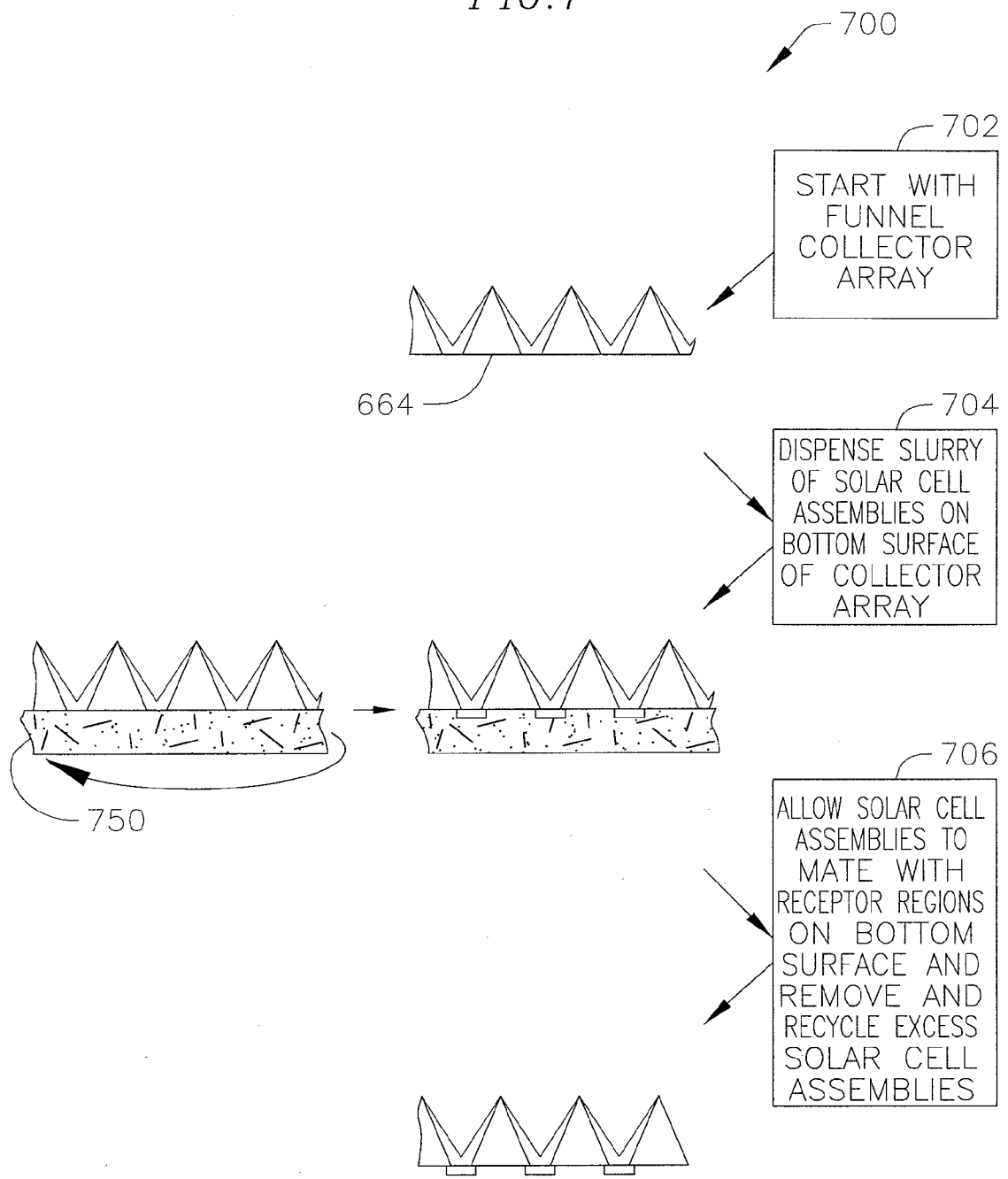
FIG. 7 is a flow diagram of a fluidic self assembly process for positioning solar cell assemblies below the funnel shaped collectors of the solar collector assembly of FIG. 6, in accordance with one embodiment of the invention.

FIG. 7 is a flow diagram of a fluidic self assembly process 700 for positioning solar cell assemblies below the funnel shaped collectors of the solar collector assembly of FIG. 6, in accordance with one embodiment of the invention. The process begins (702) with the funnel shaped collector array 664. The process dispenses (704) a slurry 750 including solar cell assemblies on a bottom surface of the collector array 664. The process allows (706) the solar cell assemblies to mate with receptor regions on the bottom surface of the collector array, and removes (706) and recycles any excess solar cell assemblies that did not mate with a receptor region. In some embodiments, the process does not perform all of the actions described in FIG. 7. In other embodiments, the process performs additional actions. In one embodiment, the process performs the actions in a different order than illustrated. In some embodiments, the process performs some of the actions simultaneously.

Figure 8:
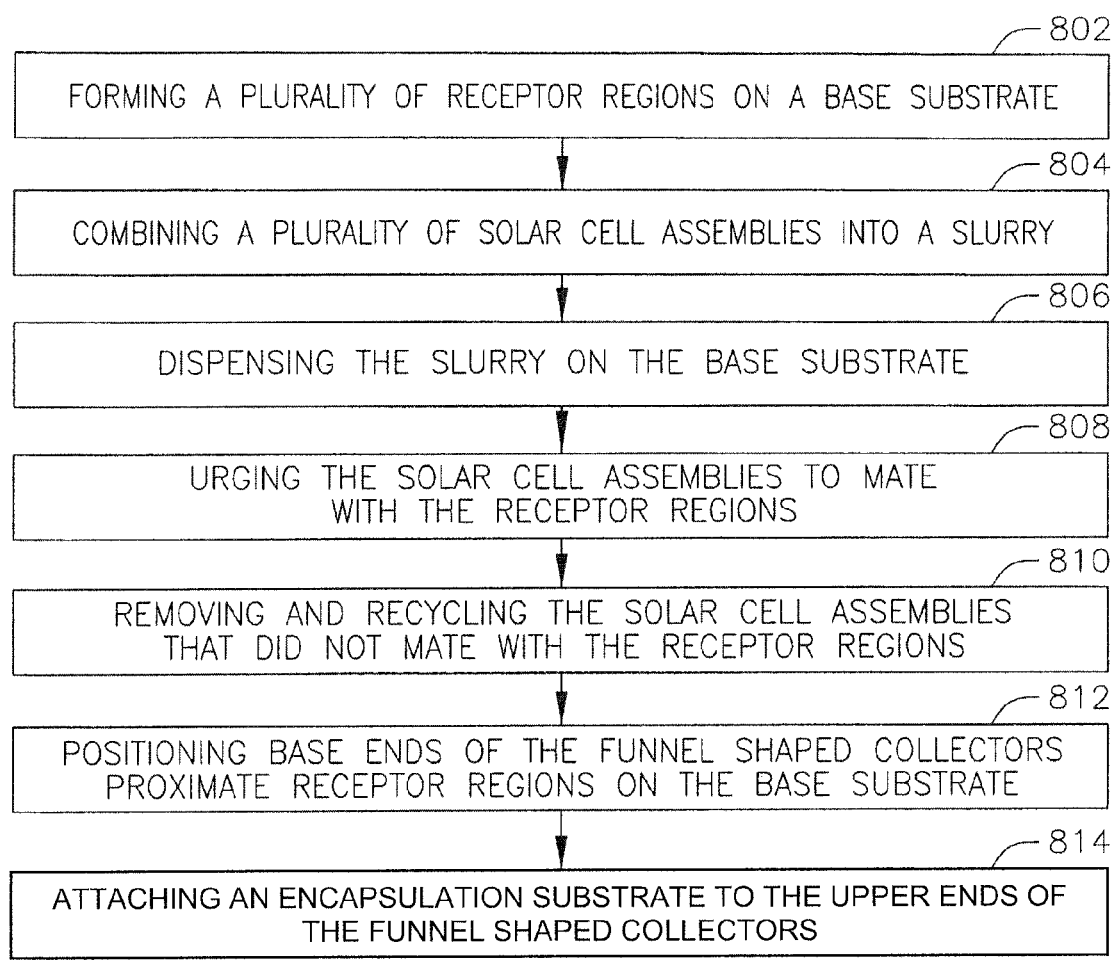
FIG. 8 is a flowchart of a another fluidic self assembly process for positioning solar cell assemblies below funnel shaped collectors of the solar collector assembly of FIG. 6, in accordance with one embodiment of the invention.

FIG. 8 is a flowchart of a another fluidic self assembly process 800 for positioning solar cell assemblies below funnel shaped collectors of the solar collector assembly of FIG. 6, in accordance with one embodiment of the invention. In several embodiments, the actions of process 800 can be used in whole or in part with other processes described above. The process forms (802) a plurality of receptor regions on a base substrate. In several embodiments, the process forms the plurality of receptor regions on the base substrate using a second preselected spacing corresponding to the preselected spacing of the funnel shaped collectors. In several embodiments, the process forms the plurality of receptor regions on the base substrate by etching a precisely shaped opening designed to accommodate a preselected shape of a solar cell assembly. The process then combines (804) a plurality of solar cell assemblies into a slurry. In a number of embodiments, each solar cell assembly is configured to mate with one of the plurality of receptor regions. In several embodiments, the slurry is a viscous fluid.

The process dispenses (806) the slurry on the base substrate. The process then urges (808) the solar cell assemblies to mate with the receptor regions. In some embodiments, the process urges the mating using gravity, magnetic fields and/or vibration. The process removes (810) the solar cell assemblies that have not mated with one of the receptor regions. In several embodiments, the process electrically interconnects the solar cell assemblies and corresponding electrical pads on the base substrate after removal of the excess solar cell assemblies. In one embodiment, the electrical interconnection can be implemented using a heating process. In one embodiment, an encapsulation layer is placed on top of the base substrate and electrical interconnections are implemented using vias in the encapsulation layer and plating metal deposited in the vias. The process positions (812) base ends of the funnel shaped collectors proximate to receptor regions on the base substrate. In one embodiment, the process aligns the plurality of funnel shaped collectors and the plurality of receptor regions on the base substrate prior to attachment. In many embodiments, the base ends of funnel shaped collectors are placed proximate the solar cell assemblies such that the solar cell assemblies receive light captured by the funnel collectors. The process then attaches (814) an encapsulation substrate (or places the encapsulation substrate adjacent) to the upper ends of the funnel shaped collectors. In several embodiments, the encapsulation substrate is thereby positioned along a plane parallel to the base substrate. In some embodiments, the process attaches a polymeric encapsulation substrate. In some embodiments, the process does not attach an encapsulation substrate.

In some embodiments, the forming a plurality of receptor regions on a base substrate further includes preparing a number of electrical connections on the base substrate to couple the solar cell assemblies in a preselected circuit architecture for generating electricity. In several embodiments, the preselected circuit architecture is dependent on the particular application for the funnel shaped collectors. In some embodiments, the electrical connections on the base substrate are implemented using substrate processing techniques known in the art, including, for example patterning of a metallic layer on the base substrate.

In several embodiments, the combining the plurality of solar cell assemblies into a slurry includes manufacturing the solar cell assemblies. In one embodiment, the solar cell assemblies can be manufactured using any number of suitable techniques known in the art. In such case, those techniques can include manufacturing the solar cell assemblies with a shape that is configured to mate with a receptor region of the base substrate.

In the embodiment illustrated in FIG. 8, the process describes one method for performing a fluidic self assembly process. In other embodiments, other suitable fluidic self assembly processes can be used. Examples of other suitable fluidic self assembly processes are described in U.S. Pat. No. 7,172,789, U.S. Pat. No. 5,783,856, and U.S. Pat. No. 5,824,186, the entire content of each document is incorporated herein by reference. In some embodiments, the process does not perform all of the actions described. In other embodiments, the process performs additional actions. In one embodiment, the process performs the actions in a different order than illustrated. In some embodiments, the process performs some of the actions simultaneously.

In the embodiments illustrated in FIGS. 6-8, the funnel collectors can be formed using one or more polymer materials. The use of polymers as compared to glass is far less expensive and easier for mass production. Polymers are also not as fragile as glass and can provide substantial longevity. As such, the use of polymers can also make the fabrication of funnel collectors substantially easier than glass.

The microfluidic self-assembly processes of FIGS. 7 and 8 illustrate two possible assembly methods, but the positioning of FIG. 6 pertains to any continuous process for manufacturing such a solar collector assembly including, but not limited to, affixing said solar cells to a surface for transfer to the base of the funnels or for lamination of said surface to the base of the funnel array. This may include processing of continuous bands of the different layers or the use of bands that transfer solar cells, electrical or fluid conduits. In yet another embodiment, the fabrication may be accomplished by panel-by-panel embossing, molding, or stamping in order to enable extraction of the sharp form features from the pyramid assemblies by motion that is aligned with the axis of the pyramid assemblies.

Figure 9:
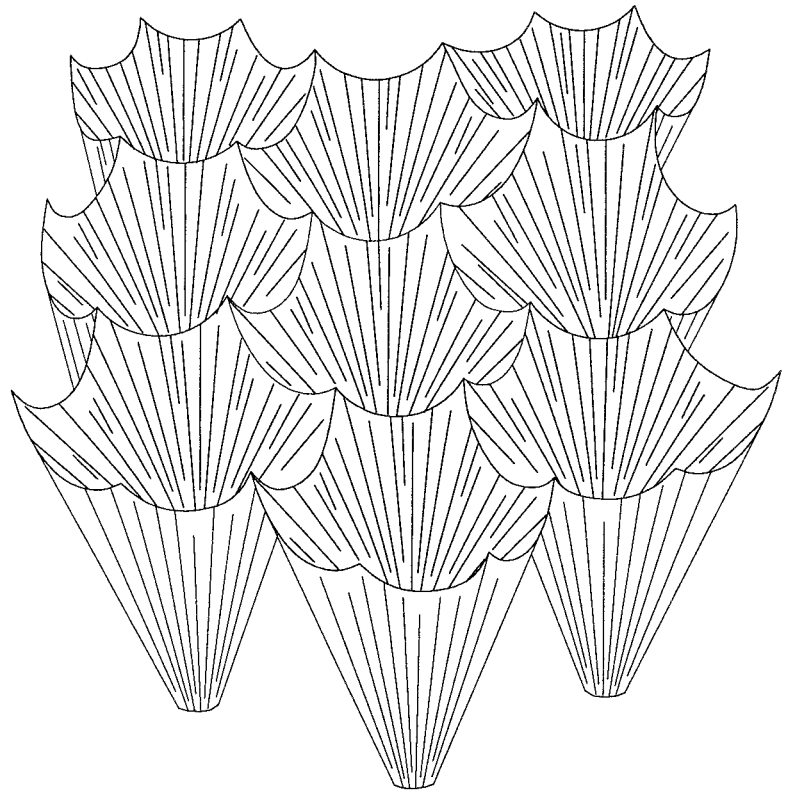
FIG. 9 is a perspective view of a funnel shaped collector array in accordance with one embodiment of the invention.

FIG. 9 is a perspective view of a funnel shaped collector array in accordance with one embodiment of the invention.

Figure 10:
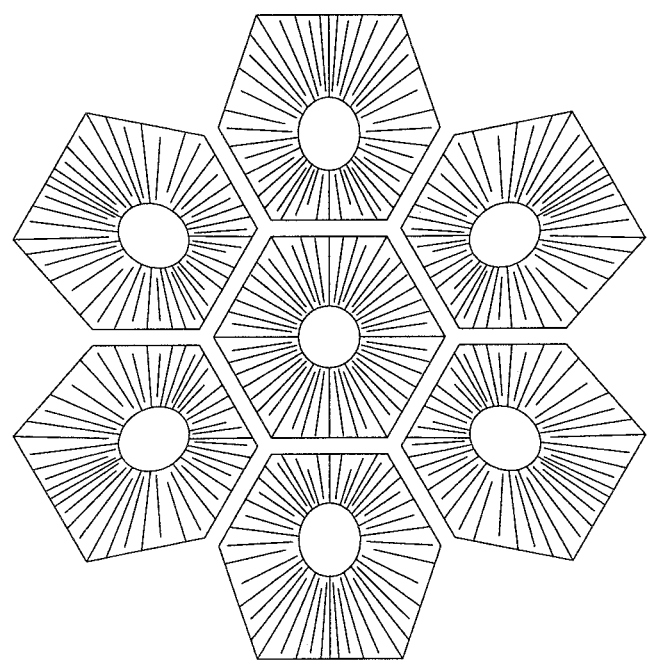
FIG. 10 is a top view of the funnel shaped collector array of FIG. 9.

FIG. 10 is a top view of the funnel shaped collector array of FIG. 9.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A solar collector assembly for collecting and concentrating light for solar cell assemblies, the collector assembly comprising:
an array of solar collectors, each comprising:
a funnel shaped collector comprising a side wall defining a tapered opening having a base aperture and an upper aperture, the side wall comprising an outer surface and an inner surface; and
a solar cell assembly positioned at the base aperture;
wherein the outer surface is at least partially coated with a material that reflects light;
wherein the upper aperture is wider than the base aperture;
wherein a thickness of the side wall increases as the side wall extends from the upper aperture to the base aperture;
wherein the funnel shaped collector is configured to split at least a portion of the light received at the inner surface into transmitted light and reflected light, and to receive the reflected light at another portion of the inner surface so that at least a portion of the reflected light impinges upon and enters the side wall;
wherein the side wall is configured to guide the light until the light exits proximate the base aperture; and
wherein the solar cell assembly is configured to capture the light exiting the base aperture.

2. The assembly of claim 1, wherein the funnel shaped collector comprises a polymeric material that is substantially transparent.

3. The assembly of claim 1, wherein a region between adjacent funnel shaped collectors of the array of funnel shaped collectors is empty.

4. The assembly of claim 1, wherein a region between adjacent funnel shaped collectors of the array of funnel shaped collectors is filled with a supporting material.

5. The assembly of claim 4, wherein the supporting material is a polymeric material.

6. The assembly of claim 1, wherein the funnel shaped collector comprises a hexagonal shape.

7. The assembly of claim 1, wherein the funnel shaped collector comprises a conical shape.

8. The assembly of claim 1, wherein the solar cell assembly comprises a photovoltaic cell.

9. The assembly of claim 1, wherein the solar cell assembly comprises a triple junction solar cell.

10. The assembly of claim 1, wherein the solar cell assembly comprises a thermoelectric device.

11. The assembly of claim 1, wherein the solar cell assembly comprises a photo-electrochemical conversion cell.

12. The assembly of claim 1, wherein the solar cell assembly comprises a photosynthesis reactor.

13. The assembly of claim 1, wherein the solar cell assembly comprises a microfluidic reactor.

14. The assembly of claim 1, wherein an encapsulation substrate is positioned to seal the upper apertures.

15. The assembly of claim 14, wherein the encapsulation substrate comprises glass.

16. The assembly of claim 14, wherein the encapsulation substrate comprises a polymeric material.

17. The assembly of claim 1, wherein the solar cell assemblies are positioned on a base substrate comprising aluminum.

18. The assembly of claim 1, wherein the solar cell assemblies are positioned on a base substrate comprising a polymeric material.

19. The assembly of claim 1, wherein an inner surface of the side wall is coated with an anti-reflective material.

20. The assembly of claim 1, wherein the outer surface and an inner surface of the side wall are curved.

* * * * *